United States Patent
Wenham et al.

(10) Patent No.: US 6,821,875 B2
(45) Date of Patent: Nov. 23, 2004

(54) LOW AREA METAL CONTACTS FOR PHOTOVOLTAIC DEVICES

(75) Inventors: Stuart Ross Wenham, Menai Heights (AU); Linda Mary Koschier, Sydney (AU)

(73) Assignee: Unisearch Limited, Sydney (AU)

( * ) Notice: Subject to any disclaimer, the term of this patent is extended or adjusted under 35 U.S.C. 154(b) by 114 days.

(21) Appl. No.: 10/275,236

(22) PCT Filed: May 4, 2001

(86) PCT No.: PCT/AU01/00515

§ 371 (c)(1),
(2), (4) Date: Nov. 5, 2002

(87) PCT Pub. No.: WO01/86732

PCT Pub. Date: Nov. 15, 2001

(65) Prior Publication Data

US 2003/0143827 A1 Jul. 31, 2003

(30) Foreign Application Priority Data

May 5, 2000 (AU) .............................................. PQ7344
Aug. 27, 2000 (AU) .............................................. PQ9637

(51) Int. Cl.$^7$ ............................................. H01L 21/44
(52) U.S. Cl. ...................... 438/597; 136/256; 136/258; 136/261; 438/96; 438/97; 438/488; 438/560; 438/607; 438/688
(58) Field of Search ........................ 117/9.93; 257/436, 257/741, 751, 928; 438/72, 96, 97, 488, 560, 597, 607, 618, 682, 688, 923, 929

(56) References Cited

U.S. PATENT DOCUMENTS 3,413,157 A * 11/1968 Kuiper ........................ 257/765
4,012,235 A * 3/1977 Mayer et al. .................. 117/9
4,781,766 A * 11/1988 Barnett et al. .............. 136/258

FOREIGN PATENT DOCUMENTS

WO        WO 9848462       * 4/1998

* cited by examiner

Primary Examiner—David A. Zarneke
Assistant Examiner—Asok Kumar Sarkar
(74) Attorney, Agent, or Firm—Dority & Manning, P.A.

(57) ABSTRACT

In a method for forming a contact on semiconductor surface, a crystalline silicon surface is first oxidized, following which an aluminium layer is deposited onto the oxide layer. A layer of amorphous silicon is then deposited onto the aluminium layer. The structure is then heated to a temperature below the aluminium/silicon eutectic temperature to locally reduce the oxide layer in regions where the quality/density of the oxide layer is lower. Simultaneously, the amorphous silicon penetrates into the aluminium layer, in which it has a high mobility. With continued heating, the aluminium penetrates completely through the oxide layer in localized regions, exposing the crystalline silicon surface. The exposed silicon surface provides a sight for nucleating epitaxial growth, which occurs rapidly as silicon within the aluminium continuously feeds the solid phase epitaxial growth process. The rapid epitaxial growth facilitates the formation of a new crystalline silicon layer that occupies the original space where the oxide layer was grown. The epitaxially grown silicon provides a bridge between the original p-type silicon surface and the metal layer and is itself doped p-type such that the metal is in electrical contact with the original silicon surface via the epitaxially grown silicon in the localized regions where the oxide layer was reduced.

82 Claims, 10 Drawing Sheets

LOW AREA METAL CONTACTS FOR PHOTOVOLTAIC DEVICES

INTRODUCTION

The present invention relates generally to the field of photovoltaic device construction and in particular the invention provides a low cost method of forming contacts to surfaces of silicon wafers and thin film devices.

BACKGROUND

A particular challenge for photovoltaic devices is to minimize recombination at the surfaces. With crystalline silicon devices, a common approach for passivating the surface is through thermal oxidation of the silicon surface. However, once the silicon dioxide layer is formed or grown or deposited onto the crystalline silicon surface, it is then an involved process to enable electrical contact to be made through the silicon dioxide layer to the underlying silicon material. In laboratory technologies, the most common approach for forming electrical contact through the silicon dioxide layer is through the use of photolithography and a mask aligner to facilitate the formation of openings in the silicon dioxide layer. Metal can then be applied which will only contact the silicon in the regions where the opening in the silicon dioxide have been formed. This approach allows precise location for the metal contacts as well as careful control over the silicon/metal contact area, which in general, if too large, will have detrimental consequences for device performance.

Most commercial solar cells use screen-printed metal contacts, which in general cannot be easily formed through a good quality surface passivating silicon dioxide layer. Such devices therefore normally avoid the use of silicon dioxide layers for surface passivation and therefore generally have relatively low open-circuit voltages compared to laboratory technologies. One commercial technology that does use a surface dielectric layer for surface passivation is the buried contact solar cell. These devices use laser scribing to penetrate through the dielectric layer to facilitate the formation of ohmic contacts to the underlying silicon. In this instance, the laser is used to perform an equivalent function as the photolithographic approaches for laboratory cells. One of the difficulties however, with both the laser grooving approach and the photolithographic approaches for forming metal contacts, is that in general, both require a heavy diffusion of the appropriate polarity of dopants to form a heavily doped region at the exposed silicon surface, to facilitate the formation of a low contact resistance interface between the silicon and the metal.

The challenge of forming ohmic contacts to the silicon material while simultaneously achieving good surface passivation for the remainder of the front and rear surfaces, becomes even more important for thinner devices. In general, thinning of bulk devices has the potential to improve performance and economics provided the surfaces are well passivated. Unfortunately however, all current commercial technologies sustain significant performance degradation when substrates are made thinner due to the relatively poor surface passivation. Ultimately, polycrystalline silicon devices need to be made with thickness' below 10 microns to achieve the ultimate economic goals for this type of technology.

SUMMARY OF THE INVENTION

According to a first aspect, the present invention consists in a method of forming a connection to a region of first semiconductor material in a semiconductor device, the method comprising the steps of:

forming a passivation layer over the semiconductor surface to be contacted;

forming a layer of metal material over the passivation layer;

forming a layer of second semiconductor material over the layer of metal material, and heating the device, the second semiconductor material being selected to have a high mobility in the metal material at a temperature below the eutectic temperature of an alloy of the metal material and the second semiconductor material, the second semiconductor material being suitable for making electrical connection to the first semiconductor material, and the metal being selected to reduce at least weakened areas of the passivation layer at temperatures below the eutectic temperature, to thereby form openings in the passivation layer and the heating step including heating the device to a temperature below the metal material/second semiconductor material eutectic temperature at which the metal reduces the passivation layer at least in weakened areas of the passivation layer, the second semiconductor material being absorbed by the metal material, and migrating through the metal material during the heating step to be deposited on the passivation layer by solid phase epitaxial growth whereby the semiconductor material growth commences at nucleation sites on the semiconductor surface in the openings formed in the passivation layer where the passivation layer has been reduced by the metal layer.

According to a second aspect, the present invention consists in a method of forming a connection to a region of first semiconductor material in a semiconductor device, the method comprising the steps of:

forming a layer of second semiconductor material over a surface of the first semiconductor material to which the connection is to be made;

forming a passivation layer over the layer of second semiconductor material;

forming a layer of metal material over the passivation layer, the second semiconductor material being selected to have a high mobility in the metal material at a temperature below a eutectic temperature of an alloy of the metal material and the second semiconductor material, and the second semiconductor material being suitable for making electrical connection to the first semiconductor material; and heating the device, the metal being selected to reduce at least weakened areas of the passivation layer at temperatures below a eutectic temperature of an alloy of the metal material and the first semiconductor, to thereby form openings in the passivation layer, and the heating step including heating the device to a temperature, which is below the metal material/second semiconductor material eutectic temperature but at which the metal reduces the passivation layer at least in weakened areas of the passivation layer, and at which the second semiconductor material is absorbed by the metal material and the metal material migrates through the second semiconductor material until it contacts the surface of the first semiconductor material and whereafter the second semiconductor material absorbed by the metal material is deposited on the the surface of the first semiconductor material by solid phase epitaxial growth, the semiconductor material growth commencing at nucleation sites on the first semiconductor surface in areas in the region of the openings formed in the passivation layer where the passivation layer has been reduced by the metal layer.

Preferably, the first semiconductor material at the surface to which the contact is to be made, is a crystalline silicon material (either polycrystalline or single crystal material).

The material of the second semiconductor material layer is preferably amorphous silicon material, the metal is preferably aluminium and the heating step is preferably performed at a temperature less than the aluminium/silicon eutectic temperature of 577° C.

According to a third aspect, the present invention consists in a method of forming a contact on a crystalline silicon semiconductor surface, the method comprising the steps of:

forming an oxide passivation layer over the crystalline semiconductor surface;

forming an aluminium layer over the passivation layer;

forming an amorphous silicon layer over the aluminium layer and heating the device to a temperature at which reduction commences in the passivation layer to form an opening through the passivation layer to expose the crystalline silicon surface, and silicon from the amorphous layer is dissolved in the metal layer and rapidly migrates through the metal layer to become a source for solid phase epitaxial growth of silicon at nucleation sites on the exposed crystalline silicon surface, whereby contact to the crystalline silicon surface is made via the epitaxially grown silicon in the openings in the passivation layer and the metal layer.

According to a fourth aspect, the present invention consists in a method of forming a contact on a surface of a crystalline silicon semiconductor material, the method comprising the steps of:

forming a layer of amorphous silicon material over the surface of the crystalline semiconductor material to which the contact is to make connection;

forming an oxide passivation layer over the layer of amorphous silicon material;

forming an aluminium layer over the passivation layer; and heating the device to a temperature at which reduction commences in the passivation layer, to form an opening through the passivation layer and to expose the amorphous silicon layer, the amorphous silicon then being dissolved in the metal layer and the metal material rapidly migrates through the amorphous silicon layer until it contacts the surface of the crystalline semiconductor material after which the metal material becomes a source for solid phase epitaxial growth of silicon at nucleation sites on the crystalline silicon surface contacted by the metal material, whereby contact to the crystalline silicon surface is made via the aluminium layer and the epitaxially grown silicon in the openings in the passivation layer.

Preferably, at least in regard to the first and third aspects of the invention the passivation layer is formed by oxidization of the crystalline silicon surface.

Preferably also, in regard to the first and third aspects of the invention, the heating step is performed in two stages, the first stage being before commencement of the deposition of the final semiconductor layer (i.e., the amorphous silicon layer) such that the reduction of the passivation layer (i.e., the oxide layer) is well advanced before the amorphous silicon is absorbed into the metal layer.

The second heating stage is used to speed the migration of the semiconductor material through the metal layer and to enhance the epitaxial growth and is preferably performed during or after the step of depositing the final semiconductor layer. This second heating stage can be coincidental with the step of deposition of the final semiconductor layer as, for example, the temperature at which a Plasma Enhanced Chemical Vapour Deposition (PECVD) chamber or sputtering chamber may operate to deposit this layer can be chosen to be suitable for the epitaxial growth process.

While embodiments of the invention will be described with reference to silicon dioxide, other oxides can potentially be used as a passivation layer as also can a range of alternative dielectrics with the primary requirement being that the aluminium or alternative metal is able to penetrate through the corresponding dielectric to facilitate epitaxial growth of silicon from the existing semiconductor surface (e.g. Silicon or polycrystalline silicon surface). A range of metals (in addition to aluminium) can be used for metal mediated solid phase epitaxial growth and are suitable for use in embodiments of the invention.

In embodiments of the invention, other dopants may replace aluminium and can potentially lead to the growth of n-type material, therefore making it feasible to apply the invention with the reverse polarity for all layers of semiconductor material described hereinafter and shown in the figures. The preferred range of passivation layer thickness is from 2 to 400 nanometers. However, passivation layer thickness from outside this range may also function satisfactorily in some circumstances.

When forming a continuous layer for the solid phase epitaxially grown p-plus material, it is preferable to use similar volumes of amorphous silicon material to the volume of metal material previously deposited (i.e. similar thickness layers). The preferred dimensions for both the metal layer and the epitaxially grown layer are in the order of 0.6 microns. However, embodiments have been successfully fabricated using aluminium layers ranging from 10 nanometers to 1 micron, with corresponding amorphous silicon layers of similar dimensions, when trying to form continuous layers of solid phase epitaxially grown material. In each case, reduced volume of amorphous silicon deposition relative to the aluminium deposition will cause the formation of structures where the p-plus material is only grown in localized regions which can have significant advantages for some devices.

Throughout this specification the word "comprise", or variations such as "comprises" or "comprising", will be understood to imply the inclusion of a stated element, integer or step, or group of elements, integers or steps, but not the exclusion of any other element, integer or step, or group of elements, integers or steps.

Any discussion of documents, acts, materials, devices, articles or the like which has been included in the present specification is solely for the purpose of providing a context for the present invention. It is not to be taken as an admission that any or all of these matters form part of the prior art base or were common general knowledge in the field relevant to the present invention as it existed in Australia before the priority date of each claim of this application.

BRIEF DESCRIPTION OF THE DRAWINGS

Embodiments of the invention will now be described, by way of example, with reference to the accompanying drawings in which:

FIGS. 4(a) & (b) are photographs of sections through a semiconductor device at two points in its manufacturing process;

FIGS. 5(a) & (b) are photographs of sections through a device at a point in the manufacturing process, FIG. 5(b) being a magnified view of the photograph of FIG. 5(a);

DETAILED DESCRIPTION OF THE PREFERRED EMBODIMENTS

Figure 1:
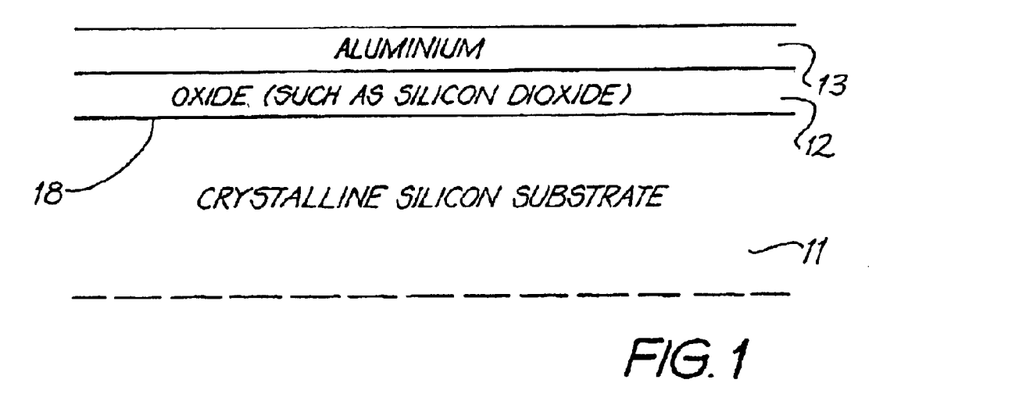
FIGS. 1 to 3 are diagrams illustrating steps in the process according to an embodiment of the present invention.

This invention involves the formation of new photovoltaic device structures and new approaches for forming these structures. In a preferred embodiment, a crystalline or polycrystalline silicon surface 18 is first oxidized to form an oxide layer 12, following which an aluminium layer 13 (or a layer of an alternative suitable metal) is deposited onto the oxide layer 12 as shown in FIG. 1.

Figure 2:
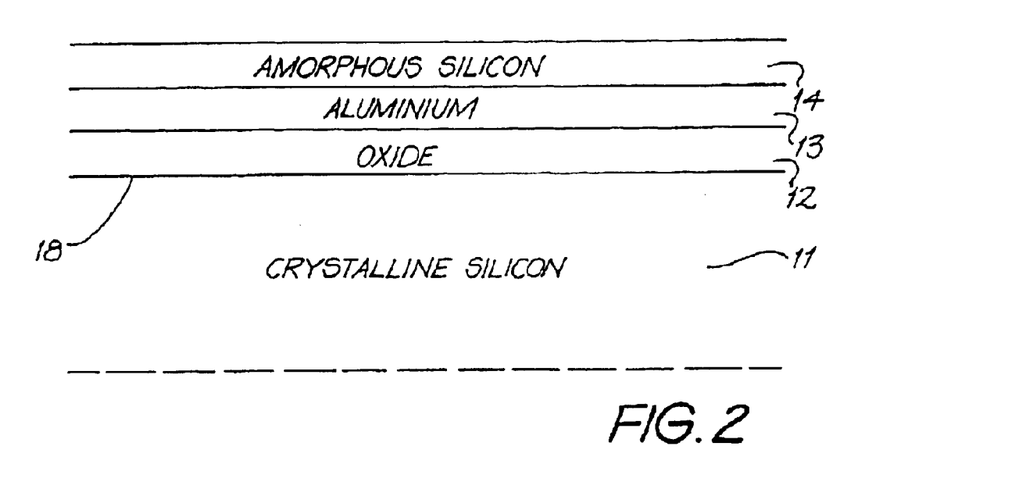

In the simplest implementation, a layer of amorphous silicon 14 is then deposited onto the aluminium layer 13 as shown in FIG. 2. The structure is then heated to a temperature below the aluminium/silicon eutectic temperature of 577° C. Heating allows the aluminium to begin reducing the oxide layer to form openings 17, which occurs preferentially in localized regions where it appears the quality/density of the oxide layer 12 is lower. Simultaneously, the amorphous silicon 14 penetrates into the aluminium layer 13, in which it has a high mobility. Eventually, the aluminium 13 penetrates completely through the oxide layer 12 in localized regions, therefore exposing the crystalline silicon surface in the openings 17. The exposed silicon surface 18 provides a sight for nucleating epitaxial growth, a process which then occurs quite rapidly as silicon within the aluminium continuously feeds the solid phase epitaxial growth process. The rapid epitaxial growth facilitates the formation of a new crystalline silicon layer 19 that occupies the original space in the openings 17 where the oxide layer 12 was originally grown. Once the thickness of the epitaxial layer 19 equals that of the original oxide layer 12, the subsequent growth is lateral (horizontal to the silicon surface) producing a crystaline layer 15. This lateral growth process subsequently shields the underlying oxide layer 12, protecting it from further reduction by the aluminium layer 13, which is displaced away from the oxide layer by the crystalline silicon layer 15.

Figure 3:
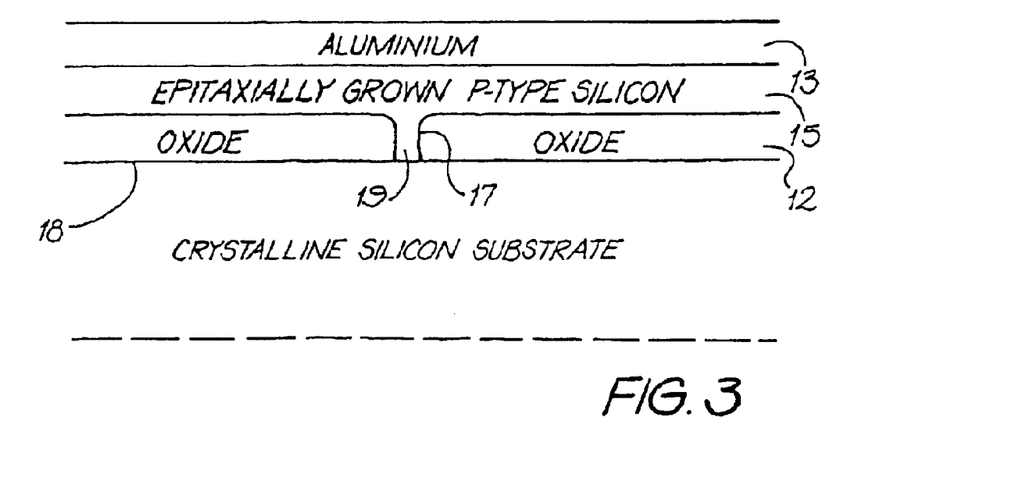

The final structure is as shown in FIG. 3, with the epitaxially grown layer being heavily p-typed doped due to the incorporation of aluminium at its solid solubility for the growth temperature. This final structure has been shown to simultaneously achieve good surface passivation for the original silicon surface 18 while facilitating electrical contact being made between the aluminium 13 and the original silicon substrate material 11.

The relatively uncontrolled nature of this process result in the formation of an effective very high contact resistance by virtue of the fact that the openings 17 in the oxide layer 12 through which the epitaxial growth takes place, are extremely small in cross section and low in density.

Figure 4:
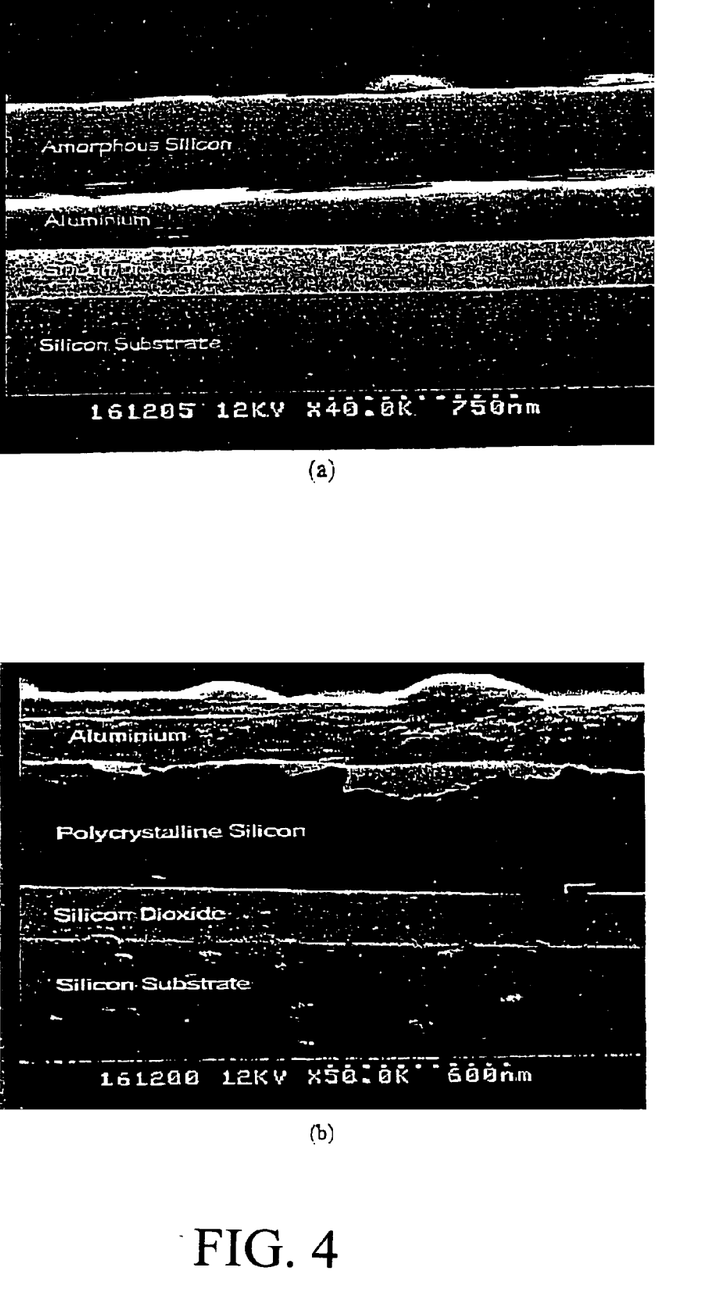

FIG. 4 shows a scanning electron micrograph of the above process with (a) showing the as deposited layers and (b) showing the layers following heat treatment with the polysilicon layer having been shown to have epitaxially grown off the original silicon surface and therefore possessing the same crystallographic orientation. The spikes that have grown epitaxially to link the parallel silicon layers have been too small in cross section to locate when preparing samples for scanning electron micrographs. Interestingly, another benefit of this structure derived by the slim nature of the spikes through the dielectric is that the grown epitaxial layer can be relatively easily separated from the original substrate. This can be done chemically (such as by etching away the dielectric and then the spikes) or mechanically (such as by heating to make use of the different thermal expansions of the relative materials to cause stress, particularly at the interfaces). The substrate can then be potentially re-used while the grown layer can be bonded to a foreign supporting superstrate/substrate either before or after lift-off and then fabricated into a device.

Figure 5:
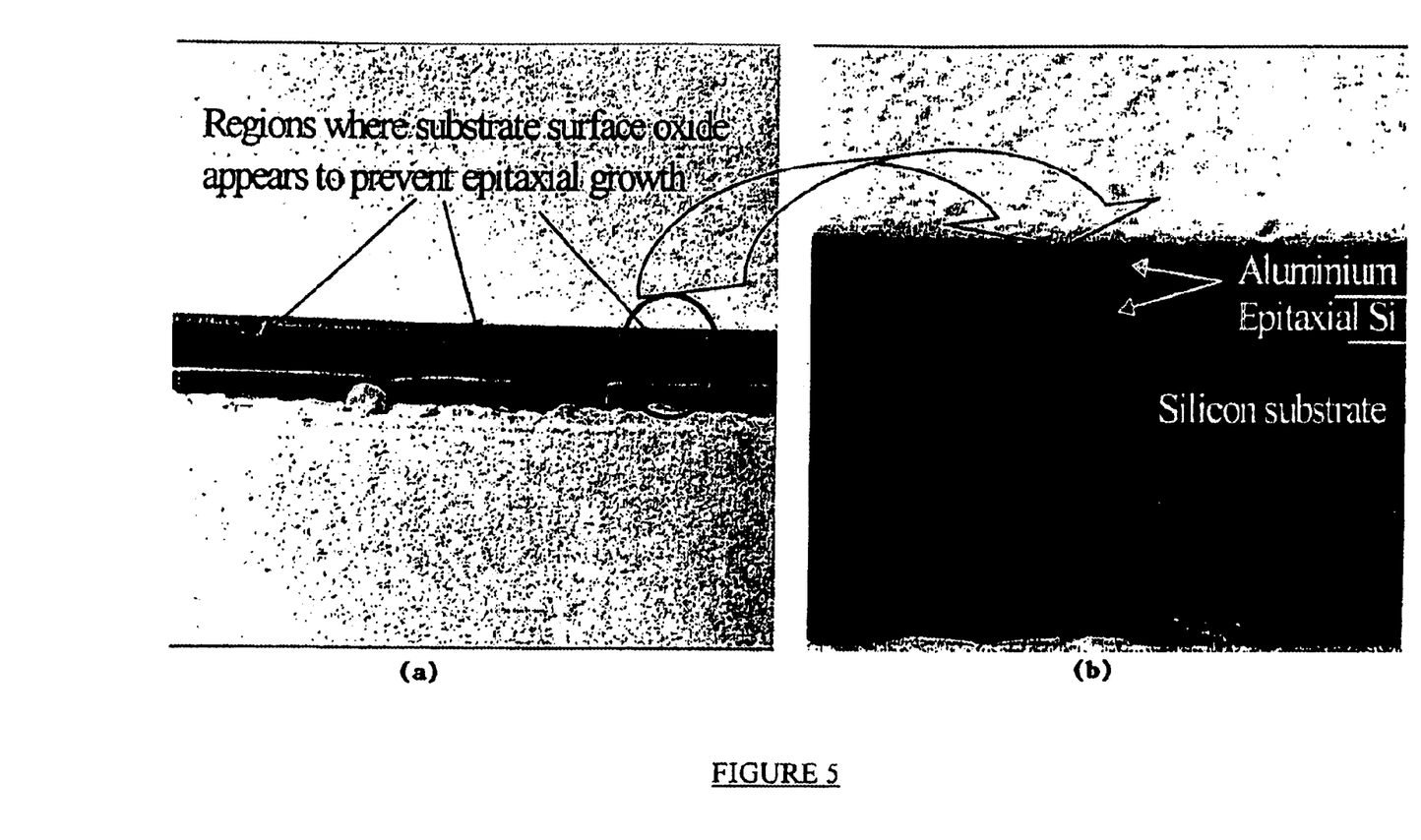

In a preferred implementation of the invention, a time delay is introduced between the steps of forming the structure of FIG. 1, and depositing the amorphous silicon. During this time delay, the structure is heated to a temperature below the aluminium/silicon eutectic temperature of 577° C. (or for short carefully controlled durations above 577° C. prior to contact between the aluminium and the silicon surface), to again provide the aluminium with the opportunity to reduce the underlying oxide layer in localized regions. By delaying the deposition of the amorphous silicon, the aluminium is able to continue reducing the oxide layer beyond the time when the silicon surface is initially exposed. This extra period allows more of the silicon surface to be progressively exposed with the eventual area of exposed silicon being determined by 3 key parameters: the thickness of the oxide layer; the temperature to which the structure of FIG. 1 is exposed to; and the duration of the exposure. Other factors can also affect the rate at which the aluminium reduces the oxide such as the quality/density of the oxide layer. However, the three mentioned parameters for a given oxide/dielectric type can be used to determine and achieve the desired area of silicon surface exposure. At this stage, the amorphous silicon is deposited as previously, with a subsequent heat treatment facilitating the same epitaxial growth process as described earlier, except in this case, with larger cross-section for the growth taking place perpendicularly to the silicon surface. Again, once the epitaxial growth in the perpendicular direction to the silicon surface reaches the original interface between the aluminium and amorphous silicon layers, subsequent epitaxial growth of the silicon takes place laterally in a direction horizontal or parallel to the crystalline silicon surface. Time dependent focused ion beam (FIB) studies have been used to verify this process with FIGS. 5(a) & (b) showing how adjacent regions of epitaxial growth are close to impinging on each other through the lateral growth process described above. In this case, it is clear that in the regions where the silicon surface is still protected from the oxide, no silicon growth has taken place with aluminium still being present in the region between adjacent grains or crystals.

Embodiments of the present invention will allow the achievement of a broad range of desired cross-sectional area to be achieved in the regions through which electrical contact is made to the original silicon surface. This cross-sectional area is determined primarily by the duration of the heat treatment prior to amorphous silicon deposition. Heat treatments of virtually any length can be used with zero length heat treatment facilitating electrical contact but with such high effective contact resistance to be essentially useless for any photovoltaic application. At the other extreme, excessively long heat treatment for the structure of FIG. 1, results in excessive reduction of the underlying oxide and hence poorer effective passivation of the underlying silicon surface. In between these extremes, a broad range of effective contact resistances can be achieved to satisfy the requirements of the particular device and its application. For instance, for concentrator devices, the contact resistance needs to be less (therefore needing a longer heat treatment), while for photovoltaic devices operating in lower light areas, the contact resistance can afford to be substantially higher, therefore necessitating shorter heat treatments.

The solid phase epitaxial growth process that facilitates the formation of the p+ layer growing onto the exposed silicon surface is well documented in the literature.

The benefits described in embodiments of the invention, when forming a contact to the silicon substrate include:

the achievement of a well passivated surface in the regions where the integrity of the oxide layer is not destroyed by the aluminium;

the achievement of virtually any desired contact area to the original silicon or substrate surface within a broad range of values;

the achievement of a heavily doped p+ region directly between the aluminium metal and the active silicon material in the substrate which effectively shields the high surface recombination velocity associated with the metal/silicon interface from the active regions of the device; and the automatic restriction of the epitaxially grown regions to the immediate vicinity of where the original silicon surface is exposed so as to retain a good aluminium reflector for most of the rear surface displaced from the silicon by the oxide layer.

Figure 6:
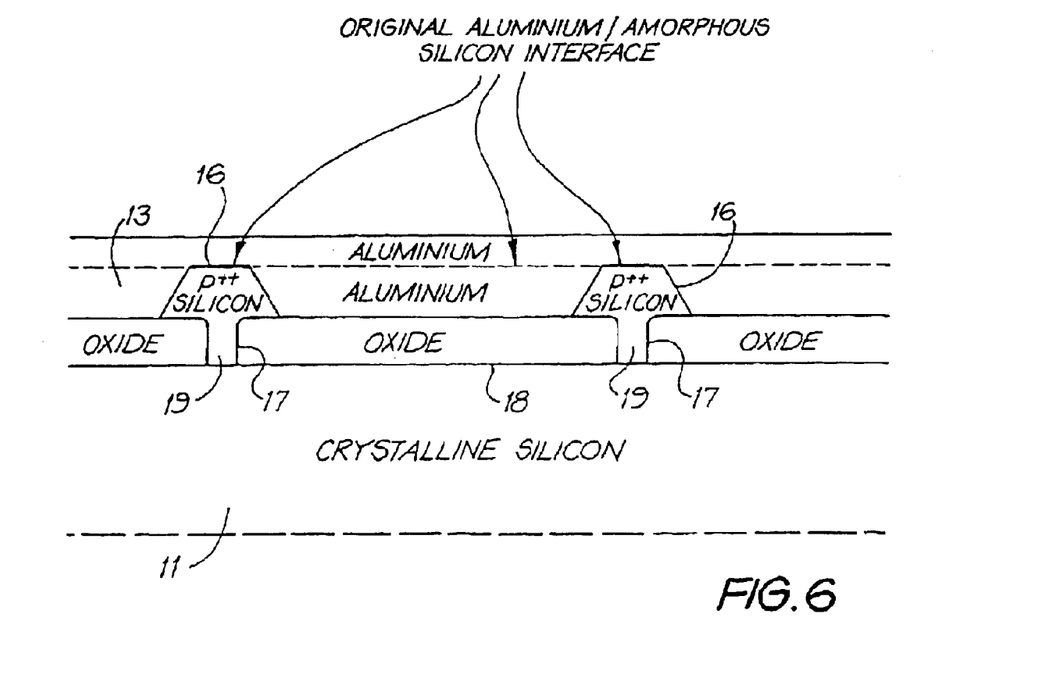
FIG. 6 is a diagram of a device according to an embodiment of the invention with contacts formed using a method according to the present invention.

With regard to the last of the advantages described above, FIG. 6 shows how the epitaxially grown material 19, 16 can be restricted to the immediate vicinity of opening 17 the where the original silicon surface 18 is exposed. This is automatically achieved by simply limiting the amount of amorphous silicon 14 deposited onto the aluminium layer. A typical example is shown in FIG. 6 where the high mobility of the silicon within the aluminium has allowed it to travel laterally to epitaxially grow onto the regions of the silicon surface 18 that were originally exposed. In this implementation, it is important to continue heating the structure for several minutes following the completion of the amorphous silicon deposition 14 to provide the opportunity for the lateral transportation of the silicon within the aluminium 13. However, excessive duration of the heat treatment at this part of the process will then allow the aluminium in regions away from the epitaxial growth to continue to reduce the oxide 12 immediately beneath the aluminium and expose additional regions of the silicon surface 18 without the availability of further silicon 14 to provide the subsequent epitaxial growth to isolate the aluminium from the original silicon surface 18. The benefit of not allowing the epitaxial growth to grow or penetrate large distances laterally is that it retains the structure over most of the area, whereby the aluminium is simply displaced from the original silicon substrate by the oxide layer. For light within the silicon striking the silicon surface, this structure as documented in the literature, provides excellent reflection, partially due to total internal reflection at the silicon/oxide interface, but enhanced greatly for the additional reflection achieved at the oxide/aluminium interface for light that escapes the silicon. These reflection properties diminish significantly for the structure of FIG. 3, with the additional disadvantage of effectively losing most of the light that is absorbed within the epitaxially grown layer.

Figure 7:
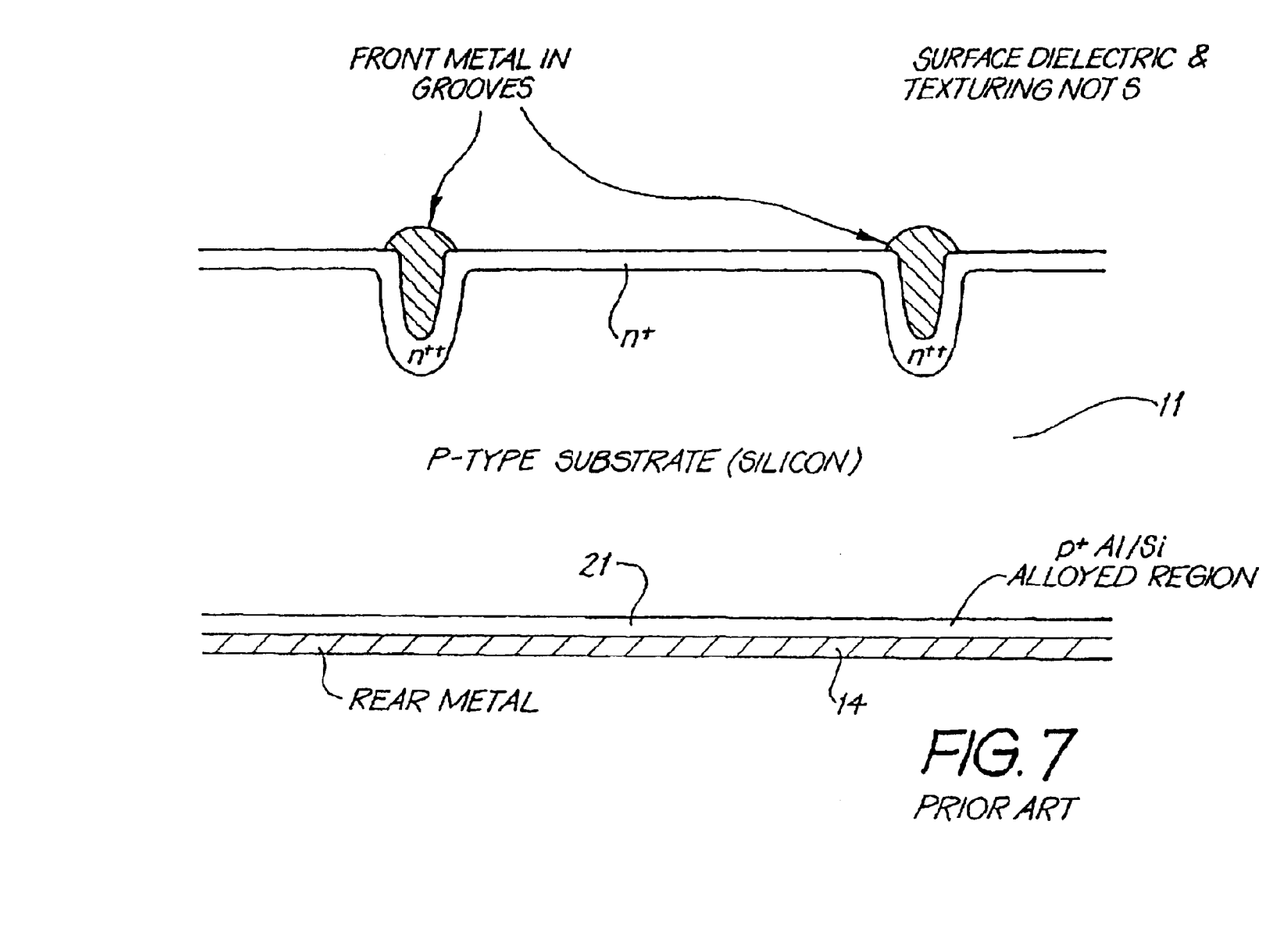
FIG. 7 is a diagram of a prior art buried contact device.

Three important structures can be formed through the use of embodiments of this invention. FIG. 7 shows the conventional buried contact solar cell where the p+ region 21 at the rear beneath the metal contact 22 is normally formed through alloying aluminium with the silicon substrate. The weakness with this structure is the relatively high effective rear surface recombination velocity associated with this rear-contacting scheme.

Figure 8:
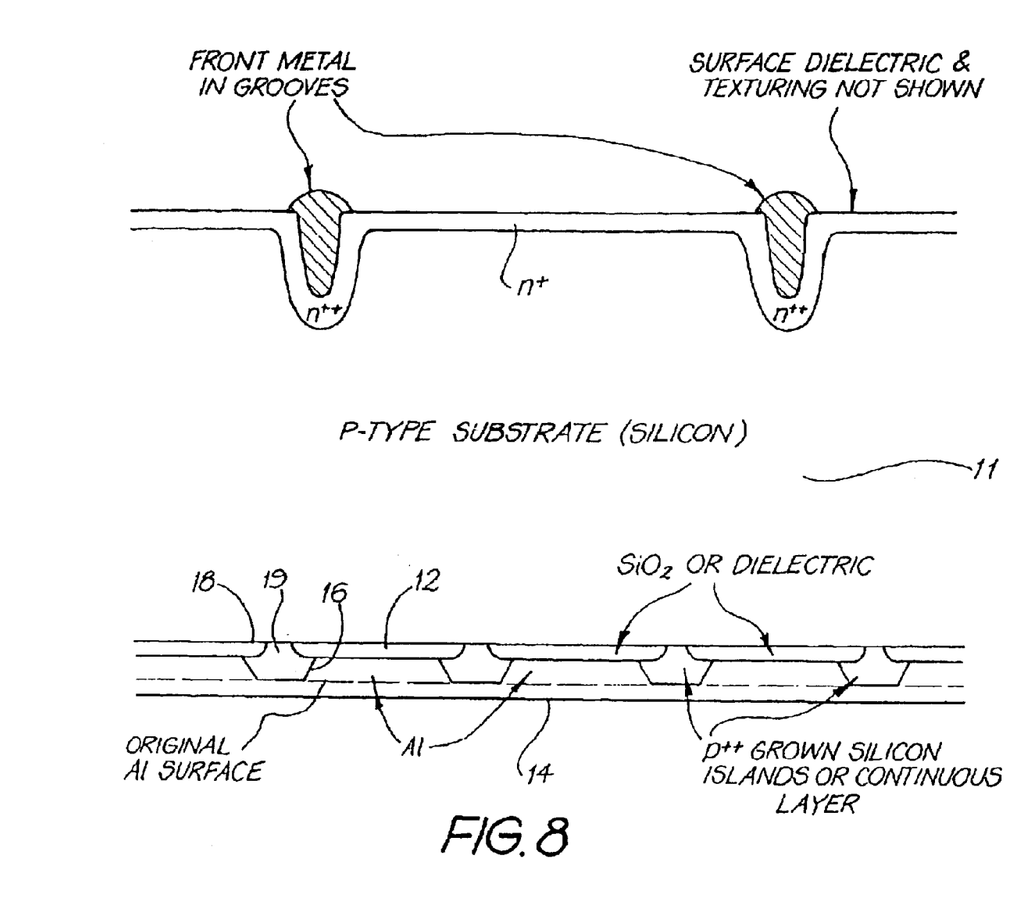
FIG. 8 is a diagram of a device similar to that of FIG. 7 with prior art front surface buried contacts made using a method according to the present invention and rear contacts formed in accordance with the present invention.

An embodiment of the present invention can be used in conjunction with the front surface design for the conventional buried contact solar cell as shown in FIG. 8 where the numerals indicate regions similar to those of FIGS. 1, 2, & 3.

Figure 9:
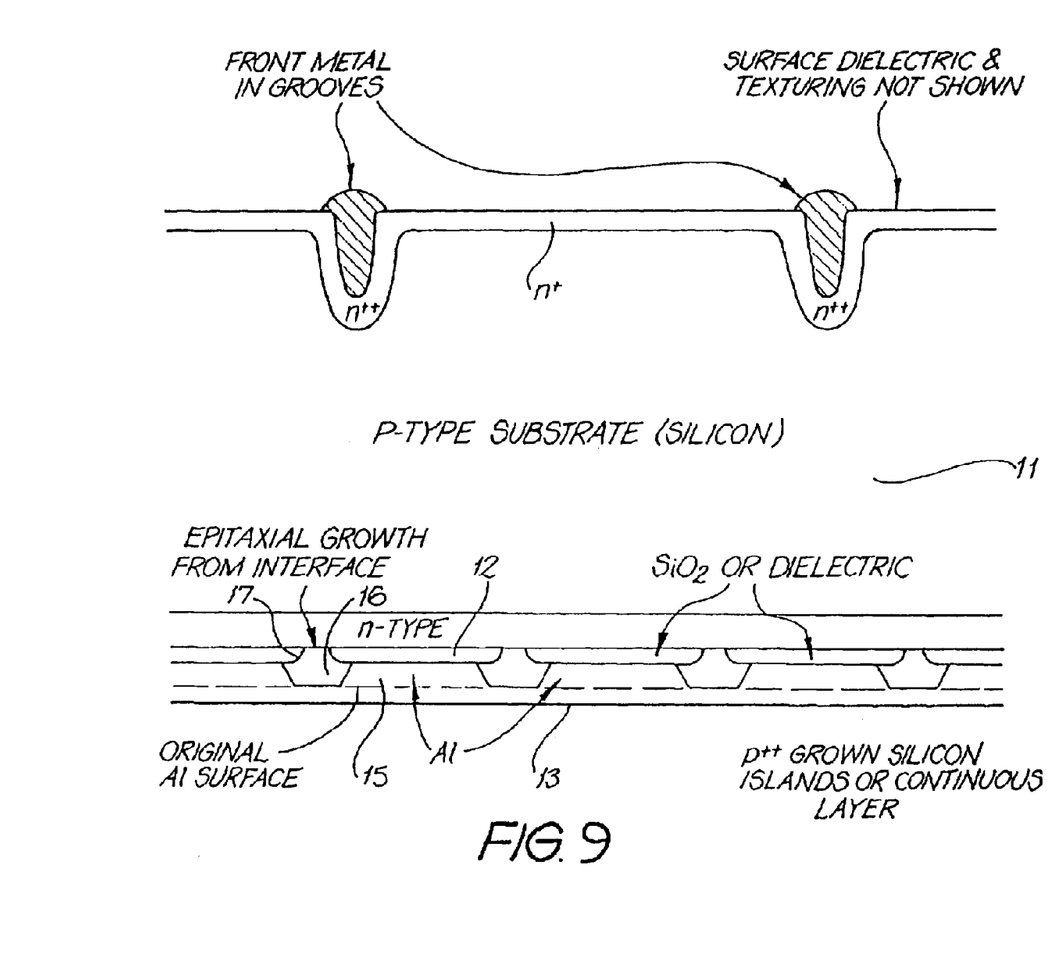
FIG. 9 is a diagram of a device similar to that of FIG. 8, but with the rear contact made to a thin rear n-type layer.

A variation of the structure from FIG. 8 is that shown in FIG. 9 where an n-type layer 22 is used at the rear of the original substrate to facilitate the formation of the thyristor structure through application of an embodiment of the present invention to form rear p-type lands 16 or alternatively a rear p-type layer 15 extending from the regions 19 in the openings 17. The benefits of this structure for photovoltaic conversion have been reported in the literature. One important advantage is that oxidized n-type surfaces have in general been reported to produce superior surface passivation than when using p-type surfaces. Consequently, in the structure shown in FIG. 9, the oxidized n-type surface towards the rear of the device will provide a lower effective, rear surface recombination velocity, than the equivalent oxidized p-type surface from FIG. 8. It should be noted in the device structures of FIGS. 8 and 9, that the invention could just as easily be applied to conventional screen printing technology since the rear contacting arrangement of the present invention can be formed in general, quite independently of the structure and contacting scheme used for the light receiving (top) surface.

Figure 10:
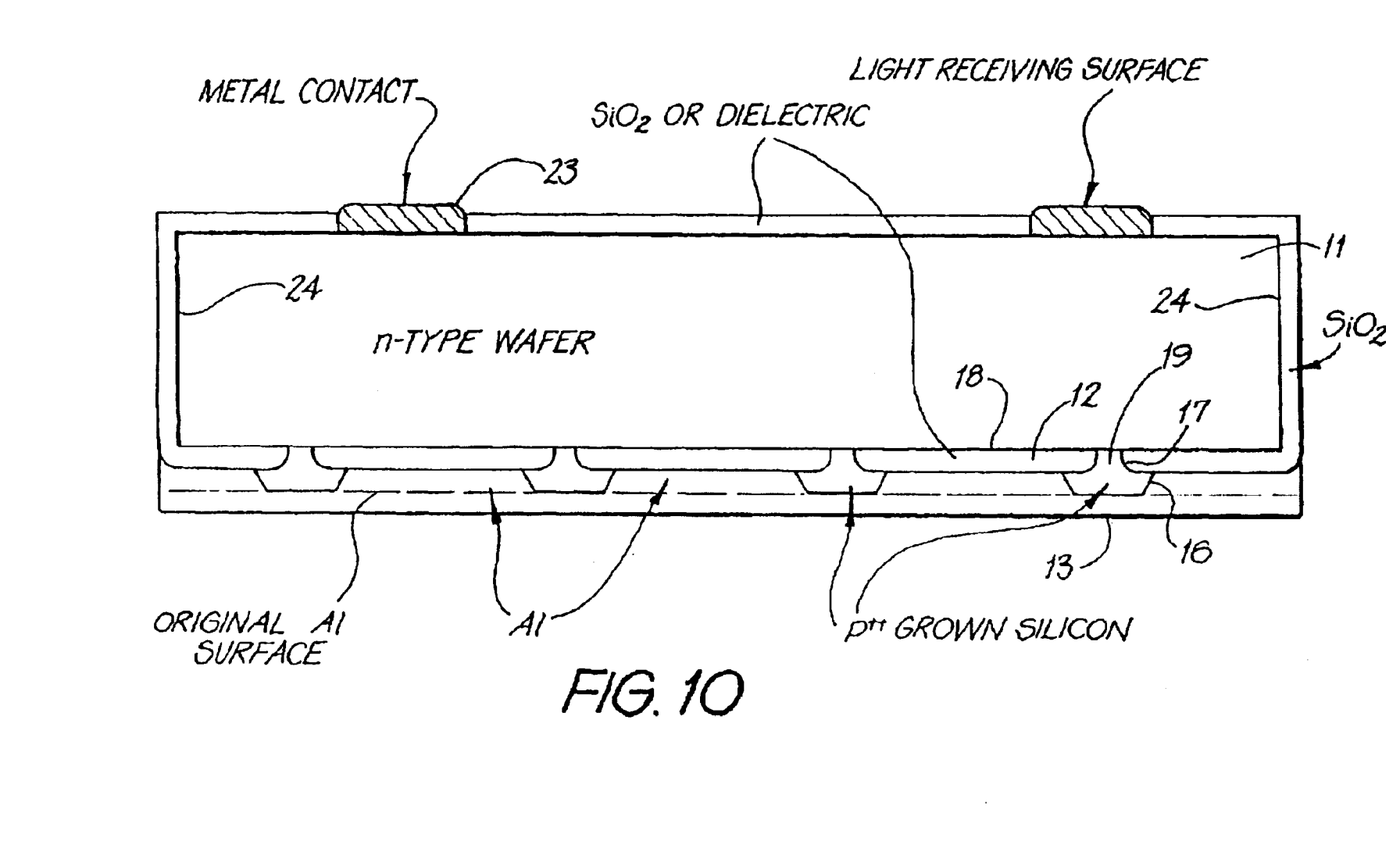
FIG. 10 is a diagram of a device almost entirely enshrouded in an oxide layer where contacts of the present invention may be advantageously used.

A third important structure is illustrated in FIG. 10 where an embodiment of the invention is applied to an n-type substrate 11. In this case, the structure is shown in conjunction with screen-printed contacts 23 on the front surface, but again, the invention can be applied independently of the front contacting scheme used. This structure of FIG. 10 is important for several reasons. Firstly, the only junctions in this device are formed where the epitaxially grown layers nucleate from the substrate surface 18. Consequently, the invention allows reasonably precise determination of the junction area for the total device, quite independently of the device area. In most photovoltaic technologies, the junction area is unavoidably the same as the total device area. De-coupling the junction area from the total device area can be important in devices where junction recombination limits device open circuit voltages and/or fill factors. This can particularly be the case with lower quality substrate materials or when certain types of contaminants or defects are present. This could particularly be the case when applying the present invention to thin film polycrystalline silicon devices, where the n-type layer could for instance, be formed directly onto a foreign substrate, such as a transparent ceramic or glass. The second important advantage of the structure of FIG. 10, is that it used n-type substrates. Virtually all present commercial substrates, are boron doped (p-type) leading to problems with minority carrier lifetime degradation when oxygen levels are high. Unfortunately, oxygen levels are high in many solar grade materials and therefore final devices have relatively poor minority carrier diffusion lengths. The same problem does not seem to occur with n-type substrates due to the absence of boron. Conclusions to this effect have been reported in the literature.

Fourthly, the structure of FIG. 10 has almost the entire device enshrouded by an oxide layer 24 formed by oxidization of the n-type surfaces. These types of surfaces have been shown and reported in the literature to produce low surface recombination velocities. Importantly, this has the added benefit of facilitating the use of thinner substrates without performance degradation, with corresponding improved economics. This could be particularly important as the trend in the photovoltaic industry is for thinner substrates to be used but with significant problems existing with current commercial technologies where thinner substrates are accompanied by performance degradation. Fifthly, the entire rear structure of this device, due to the absence of any diffusion processes, can be formed at temperatures well below the 800–900° C. normally used in conventional commercial processes that rely on solid state diffusion processes. Lower temperature processing reduces cleanliness requirements and minimizes device degradation through contamination etc. Sixthly, screen printed contacts can, if desired, be formed into the front surface of this structure relatively easily. In general, screen printed contacts are challenging, unless regions directly beneath the metal are highly doped with a corresponding deep junction that prevents shunting of the junction by the metallisation. These problems do not occur with a structure of FIG. 10 as the junctions are located at the rear of the device with the screen printed metal therefore, being able to driven into virtually any depth of the substrate. Furthermore, it opens up the opportunity to simultaneously form the front and rear (and side) oxide layers and then subsequently fire the screen printed metal through this oxide, using more severe conditions, (such as higher temperatures and or additives in the metal paste to ensure penetration through the oxide layer) without risking damage to underlying junctions.

Finally, the other advantage of this structure is that through restricting the amount of amorphous silicon sputtered onto the rear aluminium layer (confining the p+ grown regions to the immediate vicinity of the exposed substrate surface), therefore leaves the majority of the rear surface with a displaced aluminium reflector (separated from the substrate only by the oxide layer) which has excellent reflection properties as described earlier. This is important for light trapping internal to the device.

A disadvantage of the structure of FIG. 10, is that if diffusion lengths in the n-type layer are not significantly greater than the substrate thickness, then large numbers of carriers generated near the light receiving surface, will not be collected by the rear junction. This simply places greater importance on using n-type substrates that retain longer minority carrier diffusion lengths at the end of processing and also retaining the ability to thin substrates without performance loss through the achievement of well passivated surfaces. It is perhaps important to also note that interdigitated contacts can be formed whereby the aluminium is deposited in a grid type of structure with the screen printed contact to the n-type material then subsequently formed in an interdigitated formation.

It is also important to note that the structure of FIG. 10, as previously discussed, can be applied to thin film devices. In this implementation, there are a variety of ways and techniques by which the n-type thin polycrystalline silicon layer can be formed prior to the application of the invention. For thin film devices deposited onto a foreign substrate, it may be necessary for the corresponding n-type metals contacts to be also formed from the rear by having them interdigitated with the p-type contacts. Depending on the minority carrier lifetimes achieved in the epitaxially grown material (p-type layer) and the density of openings made through the oxide layer, it may be preferable to have a more continuous layer for the p-type solid phase epitaxially grown layer like the ones shown in FIG. 3 and FIG. 4(b). The latter will be the case if the minority carrier lifetimes in the epitaxially grown material are long enough to facilitate the collection of most of the carriers generated in the corresponding p-type grown layer. In this case it is still possible to have almost the entire volume of silicon active (i.e. within a diffusion length of the collecting junction), despite having the oxide layer replacing most of the junction region. The density of openings in the oxide layer will be somewhat determined by both the quality (density) of the oxide layer and its thickness.

It will also be appreciated by someone skilled in the art, that in all the implementations of the invention previously discussed, that oxides other than silicon dioxide can potentially be used as also can a range of alternative dielectrics with the primary requirement being that the aluminium or alternative metal is able to penetrate through the corresponding dielectric to facilitate epitaxial growth of silicon from the existing silicon or polycrystalline silicon surface. It has already been reported in the literature that a range of metals (in addition to aluminium) can be used for metal mediated solid phase epitaxial growth as described in this invention.

It will also be appreciated by someone skilled in the art that other dopants as a replacement for aluminium can potentially lead to the growth of n-type material therefore making it feasible to apply the invention with the reverse polarity for all layers of silicon material previously prescribed and shown in the figures. The invention has been demonstrated using oxide thicknesses ranging from 2 nanometers to 400 nanometers with corresponding epitaxial growth and metal contact formation able to able achieved in each case. This is the preferred range of oxide thickness although oxide thicknesses from outside this range are probably also feasible.

When forming a continuous layer for the solid phase epitaxially grown p+ material, it is preferable to use similar volumes of deposited amorphous silicon material to the aluminium material previously deposited (i.e. similar thickness layers). The preferred dimensions for both are 0.6 microns thickness of layer when deposited, similar to those shown in FIG. 4. However, the invention has been successfully implemented using aluminium layers ranging from 10 nanometers to 1 micron with the corresponding amorphous silicon layers of similar dimensions when trying to form continuous layers of solid phase epitaxially grown material. In each case, reduced volume of deposited amorphous silicon material relative to the aluminium deposition is necessary to achieve the structure as shown in FIG. 6, where the p-plus grown material is only in localized regions. The described relationship between the relative volumes of aluminium and amorphous material results from the fact that the epitaxially grown layer will only grow in the direction perpendicular to the original silicon surface until it strikes the original interface existing between the aluminium layer and the amorphous silicon material. It is described in the literature that a thin aluminium oxide layer forms at this interface that therefore provides a barrier that prevents the epitaxially grown material from penetrating beyond it. The subsequent lateral growth then takes on the form as shown in FIG. 6, due to the faceted growth associated with the exposed <111> planes that result from using substrates of (1,0,0) orientation. This faceted growth is clearly evident in the FIB analysis shown in FIG. 5.

A further variation for the implementation of the invention is to merge together the heat treatment following the aluminium deposition with the amorphous silicon deposition. For example, if the amorphous silicon is being sputtered, then heating the structure of FIG. 1 inside the sputtering chamber and then simply depositing the amorphous silicon at the appropriate time, allows the solid face epitaxial growth to take place in Teal time during the amorphous silicon deposition.

Figure 11:
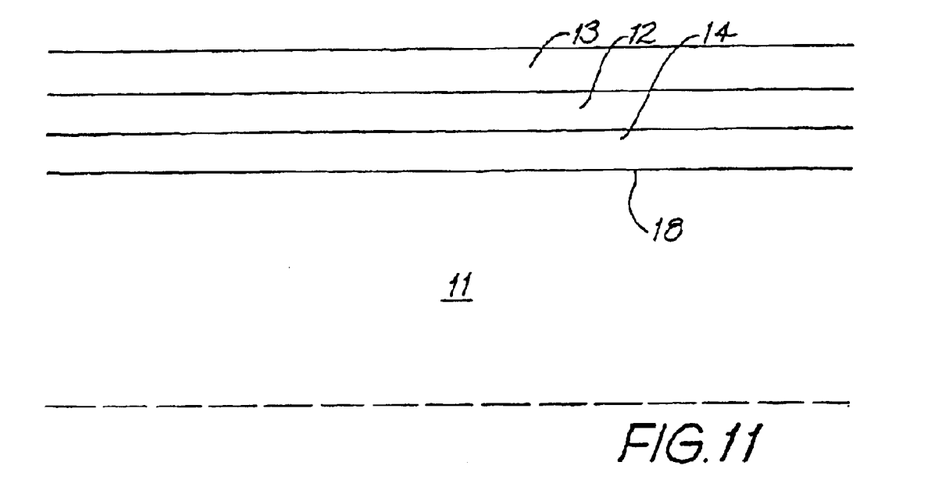
FIGS. 11 to 14 are diagrams illustrating steps in the process according to a further embodiment of the invention which employs a different processing order.
Figure 12:
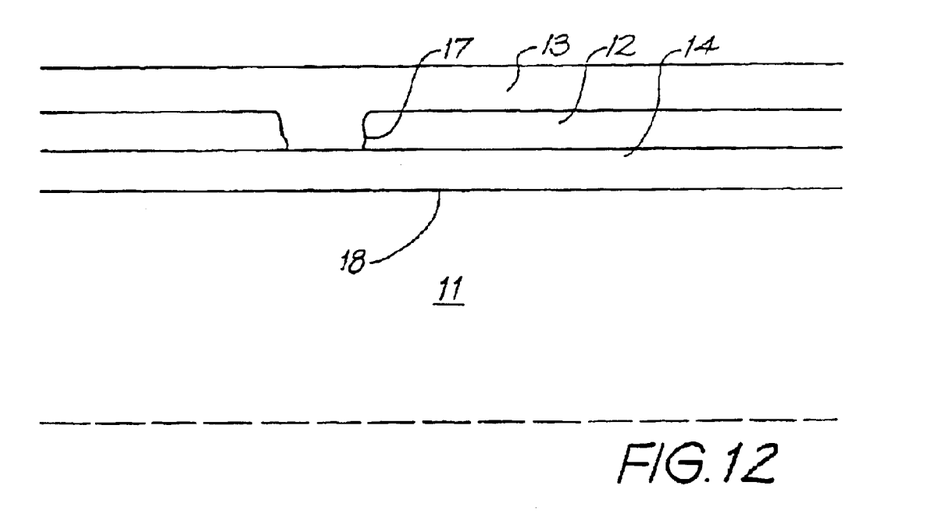
Figure 13:
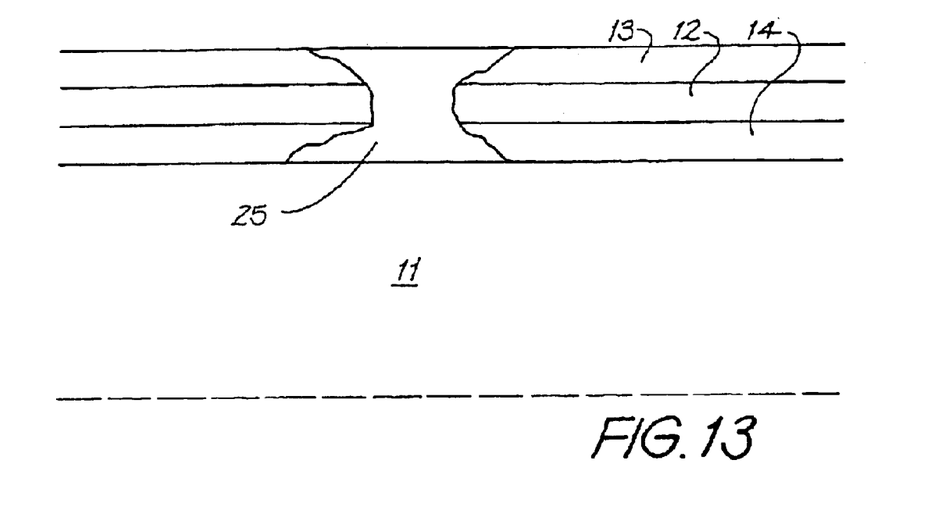
Figure 14:
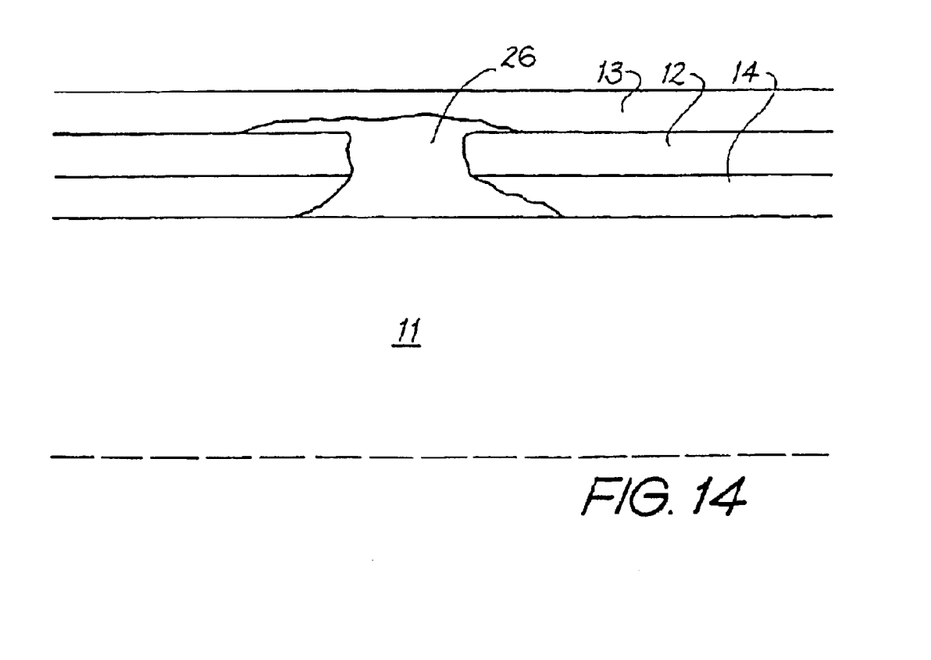

A variation on the basic process is illustrated in FIGS. 11 to 14. In this process, a layer of amorphous silicon 14 is deposited onto a surface 18 of a crystalline or polycrystalline silicon wafer or layer and an oxide layer 12 is then grown off of the amorphous silicon 14. An aluminium layer 13 (or a layer of an alternative suitable metal) is then deposited onto the oxide layer 12 as shown in FIG. 11.

The structure is again heated to a temperature below the aluminium/silicon eutectic temperature of 577° C. Heating allows the aluminium to begin reducing the oxide layer to form openings 17, which occurs preferentially in localized regions as before. After the metal penetrates the oxide layer 12, the amorphous silicon 14 penetrates into the aluminium layer 13, in which it has a high mobility forming an alloyed region 25. Eventually, the alloyed region extends down to the crystalline silicon surface 18 exposing the crystalline silicon surface in the localized regions below the openings 17. The exposed silicon surface 18 provides a sight for nucleating epitaxial growth, a process which then occurs quite rapidly as silicon within the aluminium continuously feeds the solid phase epitaxial growth process. The rapid epitaxial growth facilitates the formation of a new crystalline silicon layer 26 that occupies the original space in the openings 17 where the oxide layer 12 was originally grown and extends from the crystalline surface 18 to the remainder of the metal layer 13. This process is effective alternative in each of the embodiments previously described and may be modified similarly to the previously described process as for example by application of short carefully controlled durations above 577° C. prior to contact between the aluminium and the amorphous silicon surface.

It has been shown that amorphous silicon can be used to passivate crystalline silicon, and this process has the advantage that over most of the crystalline silicon surface 18, the amorphous silicon layer 14 is still in contact with the crystalline silicon surface after the contact is formed.

It will be appreciated by persons skilled in the art that numerous variations and/or modifications may be made to the invention as shown in the specific embodiments without departing from the spirit or scope of the invention as broadly described. The present embodiments are, therefore, to be considered in all respects as illustrative and not restrictive.

What is claimed is:

1. A method of forming a connection to a region of first semiconductor material in a semiconductor device, the method comprising the steps of:

forming a passivation layer over a surface of the first semiconductor material to which the connection is to be made;

forming a layer of metal material over the passivation layer;

forming a layer of second semiconductor material over the layer of metal material, the second semiconductor material being selected to have a high mobility in the metal material at a temperature below a eutectic temperature of an alloy of the metal material and the second semiconductor material, and the second semiconductor material being suitable for making electrical connection to the first semiconductor material; and heating the device, the metal being selected to reduce at least weakened areas of the passivation layer at temperatures below a eutectic temperature of an alloy of the metal material and the first semiconductor, to thereby form openings in the passivation layer, and the heating step including heating the device to a temperature, which is below the metal material/second semiconductor material eutectic temperature but at which the metal reduces the passivation layer at least in weakened areas of the passivation layer, and at which the second semiconductor material is absorbed by the metal material and migrates through the metal material to be deposited on the passivation layer by solid phase epitaxial growth, whereby the semiconductor material growth commences at nucleation sites on the semiconductor surface in the openings formed in the passivation layer where the passivation layer has been reduced by the metal layer.

2. The method as claimed in claim 1, wherein the passivation layer is formed by oxidization of the surface of the first semiconductor material to which the connection is to be made.

3. The method as claimed in claim 2, wherein the heating step is performed in two stages.

4. The method as claimed in claim 3, wherein a first heating stage substantially occurs before commencement of the deposition of the second semiconductor layer whereby the reduction of the passivation layer is well advanced before the second semiconductor material is absorbed into the metal layer.

5. The method as claimed in claim 4, wherein the second heating stage is performed at a temperature selected to speed migration of the second semiconductor material through the metal layer and to enhance the epitaxial growth.

6. The method as claimed in claim 5, wherein the second heating stage is performed during or after the step of depositing the second semiconductor layer.

7. The method as claimed in claim 6, wherein the second semiconductor material is formed by a Plasma Enhanced Chemical Vapour Deposition (PECVD) process and the temperature at which the second heating stage is performed is the operation temperature of a Plasma Enhanced Chemical Vapour Deposition (PECVD) chamber in which the second semiconductor material is formed.

8. The method as claimed in claim 6, wherein the second semiconductor material is formed by a sputtering process and the temperature at which the second heating stage is performed is the operation temperature of a sputtering chamber in which the second semiconductor material is formed.

9. The method as claimed in claim 5, wherein the second heating stage is coincidental with the step of deposition of the second semiconductor layer.

10. The method as claimed in claim 1, wherein the first semiconductor material is a crystalline material.

11. The method of claim 10, wherein the first semiconductor material is polycrystalline material.

12. The method of claim 10, wherein the first semiconductor material is a single crystal material.

13. The method as claimed in claim 1, wherein the second semiconductor material layer is an amorphous semiconductor material.

14. The method as claimed in claim 1, wherein the heating step is at a temperature less than a eutectic temperature of an alloy of the first semiconductor material in the metal material.

15. The method as claimed in claim 1, wherein the heating step comprises heating the device to a temperature above the eutectic temperature of an alloy of the first semiconductor material and the metal material for short durations prior to contact between the metal and the surface of the first semiconductor material to which the connection is to be made through the openings in the passivation layer, and subsequently heating the device to a temperature less than a eutectic temperature of the alloy of the first semiconductor material and the metal material.

16. The method as claimed in claim 1, wherein the passivation layer thickness is 2 nanometers or greater.

17. The method as claimed in claim 1, wherein the passivation layer thickness is 400 nanometers or less.

18. The method as claimed in claim 1, wherein the layer of metal material has a thickness in a range from 10 nanometers to 1 micron.

19. The method as claimed in claim 18, wherein the layer of second semiconductor material has a thickness which is in the same order as the thickness of the layer of metal material and the heating step produces an epitaxially grown material extending to form a continuous layer between the first semiconductor material and the metal material.

20. The method as claimed in claim 19, wherein the layer of metal material has a thickness in the order of 0.6 microns.

21. The method as claimed in claim 20, wherein the epitaxially grown layer has a thickness in the order of 0.6 microns.

22. The method as claimed in claim 18, wherein the layer of second semiconductor material has a thickness which is substantially less than the thickness of the metal material and the heating step produces an epitaxially grown material extending between the first semiconductor material and the metal material in localised regions around the openings formed in the passivation layer.

23. The method as claimed in claim 22, wherein the first semiconductor material is silicon.

24. The method as claimed in claim 23, wherein the second semiconductor material layer is amorphous silicon material.

25. The method as claimed in claim 1, wherein the surface of the first semiconductor material to which the connection is to be made is p-type material.

26. The method as claimed in claim 25, wherein the metal material is aluminium.

27. The method as claimed in claim 26, wherein the second semiconductor material layer is amorphous silicon and the heating step is at a temperature less than the aluminium/silicon eutectic temperature.

28. The method as claimed in claim 26, wherein the second semiconductor material layer is amorphous silicon, and the heating step comprises heating the device to a temperature above the aluminium/silicon eutectic temperature for short durations prior to contact between the aluminium and the silicon surface to which the connection is to be made through the openings in the passivation layer, and subsequently heating the device to a temperature less than the aluminium/silicon eutectic temperature.

29. The method as claimed in claim 1, wherein the surface of the first semiconductor material to which the connection is to be made is n type material.

30. The method as claimed in claim 29, wherein the metal material is an n type dopant in silicon.

31. The method as claimed in claim 30, wherein the second semiconductor material layer is amorphous silicon and the heating step is at a temperature less than the metal/silicon eutectic temperature.

32. The method as claimed in claim 30, wherein the second semiconductor material layer is amorphous silicon, and the heating step comprises heating the device to a temperature above the metal/silicon eutectic temperature for short durations prior to contact between the metal and the silicon surface to which the connection is to be made through the openings in the passivation layer, and subsequently heating the device to a temperature less than the metal/silicon eutectic temperature.

33. A method of forming a connection to a region of first semiconductor material in a semiconductor device, the method comprising the steps of:

forming a layer of second semiconductor material over a surface of the first semiconductor material to which the connection is to be made;

forming a passivation layer over the layer of second semiconductor material;

forming a layer of metal material over the passivation layer, the second semiconductor material being selected to have a high mobility in the metal material at a temperature below a eutectic temperature of an alloy of the metal material and the second semiconductor material, and the second semiconductor material being suitable for making electrical connection to the first semiconductor material; and heating the device, the metal being selected to reduce at least weakened areas of the passivation layer at temperatures below a eutectic temperature of an alloy of the metal material and the first semiconductor, to thereby form openings in the passivation layer, and the heating step including heating the device to a temperature, which is below the metal material/second semiconductor material eutectic temperature but at which the metal reduces the passivation layer at least in weakened areas of the passivation layer until the metal penetrates the passivation layer and contacts the second semiconductor material layer, the second semiconductor material then being absorbed by the metal material and the metal material migrating through the second semiconductor material until it contacts the surface of the first semiconductor material, whereafter the second semiconductor material absorbed by the metal material is deposited on the the surface of the first semiconductor material by solid phase epitaxial growth, the semiconductor material growth commencing at nucleation sites on the first semiconductor surface in areas in the region of the openings formed in the passivation layer where the passivation layer has been reduced by the metal layer.

34. The method as claimed in claim 33, wherein the passivation layer is formed by oxidization of the surface of the second semiconductor material.

35. The method as claimed in claim 33, wherein the first semiconductor material is a crystalline material.

36. The method as claimed in claim 33, wherein the second semiconductor material layer is an amorphous semiconductor material.

37. The method as claimed in claim 33, wherein the heating step is at a temperature less than a eutectic temperature of an alloy of the first semiconductor material in the metal material.

38. The method as claimed in claim 33, wherein the heating step comprises heating the device to a temperature above the eutectic temperature of an alloy of the first semiconductor material and the metal material for short durations prior to contact between the metal and the surface of the first semiconductor material to which the connection is to be made through the openings in the passivation layer, and subsequently heating the device to a temperature less than a eutectic temperature of the alloy of the first semiconductor material and the metal material.

39. The method as claimed in claim 33, wherein the passivation layer thickness is 2 nanometers or greater.

40. The method as claimed in claim 33, wherein the passivation layer thickness is 400 nanometers or less.

41. The method as claimed in claim 30, wherein the layer of metal material has a thickness in a range from 10 nanometers to 1 micron.

42. The method as claimed in claim 41, wherein the layer of second semiconductor material has a thickness which is in the same order as the thickness of the layer of metal material and the heating step produces an epitaxially grown material extending to form a continuous layer between the first semiconductor material and the metal material.

43. The method as claimed in claim 41, wherein the layer of metal material has a thickness in the order of 0.6 microns.

44. The method as claimed in claim 41, wherein the epitaxially grown layer has a thickness in the order of 0.6 microns.

45. The method as claimed in claim 41, wherein the layer of second semiconductor material has a thickness which is substantially less than the thickness of the metal material and the heating step produces a epitaxially grown material extending between the first semiconductor material and the metal material in localised regions around the openings formed in the passivation layer.

46. The method as claimed in claim 45, wherein the first semiconductor material is silicon.

47. The method as claimed in claim 46, wherein the second semiconductor material layer is amorphous silicon material.

48. The method as claimed in claim 33, wherein the surface of the first semiconductor material to which the connection is to be made is p-type material.

49. The method as claimed in claim 48, wherein the metal material is aluminium.

50. The method as claimed in claim 49, wherein the second semiconductor material layer is amorphous silicon and the heating step is at a temperature less than the aluminium/silicon eutectic temperature.

51. The method as claimed in claim 49, wherein the second semiconductor material layer is amorphous silicon, and the heating step comprises heating the device to a temperature above the aluminium/silicon eutectic temperature for short durations prior to contact between the aluminium and the silicon surface to which the connection is to be made through the openings in the passivation layer, and subsequently heating the device to a temperature less than the aluminium/silicon eutectic temperature.

52. The method as claimed in claim 33, wherein the surface of the first semiconductor material to which the connection is to be made is n type material.

53. The method as claimed in claim 52, wherein the metal material is an n type dopant in silicon.

54. The method as claimed in claim 53, wherein the second semiconductor material layer is amorphous silicon and the heating step is at a temperature less than the metal/silicon eutectic temperature.

55. The method as claimed in claim 53, wherein the second semiconductor material layer is amorphous silicon, and the heating step comprises heating the device to a temperature above the metal/silicon eutectic temperature for short durations prior to contact between the metal and the silicon surface to which the connection is to be made through the openings in the passivation layer, and subsequently heating the device to a temperature less than the metal/silicon eutectic temperature.

56. A method of forming a contact on a surface of a crystalline silicon semiconductor material, the method comprising the steps of:

forming an oxide passivation layer over the surface of the crystalline semiconductor material to which the contact is to make connection;

forming an aluminium layer over the passivation layer;

forming a layer of amorphous silicon material over the aluminium layer; and heating the device to a temperature at which reduction commences in the passivation layer, to form an opening through the passivation layer and to expose the crystalline silicon surface, and at which silicon from the amorphous layer is dissolved in the metal layer and rapidly migrates through the aluminium layer to become a source for solid phase epitaxial growth of silicon at nucleation sites on the exposed crystalline silicon surface, whereby contact to the crystalline silicon surface is made via the aluminium layer and the epitaxially grown silicon in the openings in the passivation layer.

57. The method as claimed in claim 56, wherein the passivation layer is formed by oxidization of the surface of the crystalline silicon material to which the contact is to make connection.

58. The method as claimed in claim 57, wherein the heating step is performed in two stages.

59. The method as claimed in claim 58, wherein a first heating stage substantially occurs before commencement of the formation of the amorphous silicon material whereby the reduction of the passivation layer is well advanced before the amorphous silicon material is absorbed into the aluminium layer.

60. The method as claimed in claim 59, wherein the second heating stage is performed at a temperature selected to speed migration of the dissolved amorphous silicon material through the aluminium layer and to enhance the epitaxial growth.

61. The method as claimed in claim 60, wherein the second heating stage is performed during or after the step of depositing the amorphous silicon material.

62. The method as claimed in claim 60, wherein the second heating stage is coincidental with the step of deposition of the amorphous silicon material.

63. The method as claimed in claim 61, wherein the amorphous silicon material is formed by a Plasma Enhanced Chemical Vapour Deposition (PECVD) process and the temperature at which the second heating stage is performed is the operation temperature of a Plasma Enhanced Chemical Vapour Deposition (PECVD) chamber in which the amorphous silicon material is formed.

64. The method as claimed in claim 61, wherein the amorphous silicon material is formed by a sputtering process and the temperature at which the second heating stage is performed is the operation temperature of a sputtering chamber in which the amorphous silicon material is formed.

65. The method as claimed in claim 56, wherein the aluminium layer has a thickness in a range from 10 nanometers to 1 micron.

66. The method as claimed in claim 65, wherein the layer of amorphous silicon material has a thickness which is in the same order as the thickness of the aluminium layer and the heating step produces an epitaxially grown material extending to form a continuous layer between the crystalline silicon material and the aluminium layer.

67. The method as claimed in claim 65, wherein the metal layer has a thickness in the order of 0.6 microns.

68. The method as claimed in claim 67, wherein the epitaxially grown layer has a thickness in the order of 0.6 microns.

69. The method as claimed in claim 65, wherein the layer of amorphous silicon material has a thickness which is substantially less than the thickness of the aluminium layer and the heating step produces an epitaxially grown material extending between the crystalline silicon material and the aluminium layer in localised regions around the openings formed in the passivation layer.

70. The method as claimed in claim 56, wherein the heating step is at a temperature less than the aluminium/silicon eutectic temperature.

71. The method as claimed in claim 56, wherein the heating step comprises heating the device to a temperature above the aluminium/silicon eutectic temperature for short durations prior to contact between the aluminium and the silicon surface to which the connection is to be made through the openings in the passivation layer, and subsequently heating the device to a temperature less than the aluminium/silicon eutectic temperature.

72. A method of forming a contact on a surface of a crystaline silicon semiconductor material, the method comprising the steps of:

forming a layer of amorphous silicon material over the surface of the crystalline semiconductor material to which the contact is to make connection;

forming an oxide passivation layer over the layer of amorphous silicon material;

forming an aluminium layer over the passivation layer; and heating the device to a temperature at which reduction commences in the passivation layer, to form an opening through the passivation layer an to expose the amorphous silicon layer, the amorphous silicon then being dissolved in the metal layer and the metal material rapidly migrating through the amorphous silicon layer until it contacts the surface of the crystalline semiconductor material after which the metal material becomes a source for solid phase epitaxial growth of silicon at nucleation sites on the crystalline silicon surface contacted by the metal material, whereby contact to the crystalline silicon surface is made via the aluminium layer and the epitaxially grown silicon in the openings in the passivation layer.

73. The method as claimed in claim 72, wherein the passivation layer is formed by oxidization of the surface of the amorphous silicon material.

74. The method as claimed in claim 73, wherein the crystalline silicon material is polycrystalline silicon material.

75. The method as claimed in claim 73, wherein the crystalline silicon material is a single crystal silicon material.

76. The method as claimed in claim 75, wherein the aluminium layer has a thickness in a range from 10 nanometers to 1 micron.

77. The method as claimed in claim 76, wherein the layer of amorphous silicon material has a thickness which is in the same order as the thickness of the aluminium layer and the heating step produces an epitaxially grown material extending to form a continuous layer between the crystalline silicon material and the aluminium layer.

78. The method as claimed in claim 77, wherein the metal layer has a thickness in the order of 0.6 microns.

79. The method as claimed in claim 78, wherein the epitaxially grown layer has a thickness in the order of 0.6 microns.

80. The method as claimed in claim 76, wherein the layer of amorphous silicon material has a thickness which is substantially less than the thickness of the aluminium layer and the heating step produces an epitaxially grown material extending between the crystalline silicon material and the aluminium layer in localised regions around the openings formed in the passivation layer.

81. The method as claimed in claim 72, wherein the heating step is at a temperature less than the aluminium/silicon eutectic temperature.

82. The method as claimed in claim 72, wherein the heating step comprises heating the device to a temperature above the aluminium/silicon eutectic temperature for short durations prior to contact between the aluminium and the silicon surface to which the connection is to be made through the openings in the passivation layer, and subsequently heating the device to a temperature less than the aluminium/silicon eutectic temperature.

\* \* \* \* \*